(12) United States Patent
Tsuji

(10) Patent No.: US 7,447,057 B2
(45) Date of Patent: Nov. 4, 2008

(54) SEMICONDUCTOR INTEGRATED CIRCUIT DEVICE WITH A PLURALITY OF MEMORY CELLS STORING DATA

(75) Inventor: Takaharu Tsuji, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 23 days.

(21) Appl. No.: 11/605,290

(22) Filed: Nov. 29, 2006

(65) Prior Publication Data

US 2007/0133265 A1 Jun. 14, 2007

(30) Foreign Application Priority Data

Dec. 1, 2005 (JP) .............................. 2005-347975

(51) Int. Cl.
*G11C 11/00* (2006.01)
(52) U.S. Cl. .................. 365/148; 365/158; 365/189.09; 365/211; 365/213
(58) Field of Classification Search .................. 365/148, 365/158, 189.09, 211, 213
See application file for complete search history.

(56) References Cited

U.S. PATENT DOCUMENTS 6,813,210 B2 * 11/2004 Okamoto et al. ............ 365/222
6,850,430 B1   2/2005 Perner
7,158,406 B2 *  1/2007 Iwata .......................... 365/158

FOREIGN PATENT DOCUMENTS

| JP | 7-211869 | 8/1995 |
| JP | 2003-257175 | 9/2003 |
| JP | 2004-185752 | 7/2004 |
| JP | 2004-288311 | 10/2004 |

* cited by examiner

*Primary Examiner*—Hoai V Ho
(74) *Attorney, Agent, or Firm*—McDermott Will & Emery LLP

(57) ABSTRACT

A semiconductor integrated circuit device includes a plurality of memory cells storing data; a write current line arranged near the memory cells or electrically connected to the memory cells; a first constant current generating circuit providing an output current having a temperature dependence; a second constant current generating circuit providing an output current having a temperature dependence different from that of the output current of the first constant current generating circuit; a mixing circuit mixing the output currents of the constant current generating circuits together to provide a composite current at a variable mixing rate; and a write current electrically connected to the write current line and writing data into the memory cell by passing a write circuit through the write current line based on the composite current provided by the mixing circuit.

9 Claims, 11 Drawing Sheets

SEMICONDUCTOR INTEGRATED CIRCUIT DEVICE WITH A PLURALITY OF MEMORY CELLS STORING DATA

BACKGROUND OF THE INVENTION

1. Field of the Invention

The present invention relates to a semiconductor integrated circuit device, and particularly to a semiconductor integrated circuit device with a plurality of memory cells storing data.

2. Description of the Background Art

In a Magnetic Random-Access Memory (MRAM), memory cells include TMR (Tunneling Magneto Resistive) elements having a TNR effect. The MRAM includes a plurality of memory cells that are aligned and arranged at crossing portions of bit lines and digit lines, respectively. The TMR element includes magnetic thin films and a tunneling oxide film held therebetween, and has a resistance which takes a minimum value when directions of the magnetic moments of the upper and lower magnetic thin films are parallel to each other, and takes a maximum value when these direction are antiparallel.

The memory cell stores logical information in accordance with "0" and "1" that correspond to the parallel relationship of the magnetic moments of the upper and lower magnetic thin films and the antiparallel relationship thereof, respectively. Drive currents of the digit line and the bit line are configured to generate a magnetic field enough to switch the directions of the magnetic moments of the magnetic thin films, whereby the logical information can be written into the memory cell. The memory cell can permanently hold the logical information until the magnetic field exceeding a certain threshold changes the directions of the magnetic moments of the upper and lower magnetic thin films. Reading of the data from the memory cell is performed by detecting the directions of the magnetic moments of the upper and lower magnetic thin films, i.e., a magnitude of the resistance value of the TMR element.

When the drive currents of write current lines, i.e., the digit and bit lines exceed a certain threshold, the data can be written into the memory cell. However, when the drive current of the bit or digit line is excessively large, the magnetic field to be exerted on a write target memory cell may affect memory cells other than the write target memory cell, i.e., the memory cells such as memory cells in a half-selected state that are located on one of the bit and digit lines corresponding to the write target memory cell, and thereby may cause them to malfunction.

Among the memory cells, there are variations in threshold of the write current required for writing data into the memory cell, i.e., in thresholds of drive currents of the digit and bit lines. Therefore, such a method has been known (e.g., see U.S. Pat. No. 6,850,430 (patent reference 1)) that tunes the write current for correctly writing the data into each memory cell, i.e., for allowing writing of the data into each memory cell while preventing a malfunction of the memory cells other than the write target memory cell. Although the write current generally has a temperature dependence, no consideration is given to the temperature dependence of the write current in the method of tuning the write current disclosed in the patent reference 1.

For example, Japanese Patent Laying-Open No. 2004-185752 (patent reference 2) has disclosed a semiconductor memory device including a write circuit that supplies a write current having a temperature dependence for dealing with the temperature dependence of the write current.

Japanese Patent Laying-Open No. 2003-257175 (patent reference 3) has disclosed the following semiconductor memory device. A write current supply is supplied with a voltage produced by a temperature-compensated voltage supply circuit, and thereby provides a write current having a desired temperature dependence.

Japanese Patent Laying-Open No. 2004-288311 (patent reference 4) has disclosed the following semiconductor memory device. The semiconductor memory device includes a plurality of word lines formed in a first direction, a plurality of bit lines formed in a second direction perpendicular to the first direction, memory cells arranged at respective crossings of the word and bit lines and including magneto-resistance elements, a row decoder selecting the word line and a column decoder selecting the bit line as well as a write circuit that supplies first and second write currents to the word and bit lines selected by the row and column decoders, respectively, and writes the data into the selected memory cell arranged at the crossing of the selected word and bit lines. The write circuit changes current values of the first and second write currents according to the temperature.

Japanese Patent Laying-Open No. 07-211869 (patent reference 5) has disclosed the following semiconductor integrated circuit. For a DRAM internally provided with a down converter, a regular transistor gate voltage control circuit performs digital control on pMOS transistors arranged in parallel. However, the semiconductor integrated circuit disclosed in the patent reference 5 is not configured to deal with a temperature dependence of the write current.

Among the memory cells, variations generally occur in write current threshold at a certain temperature, and further, variations occur in temperature dependence of the write current threshold. More specifically, when the temperature changes, the write current threshold of each memory cell varies to a degree different from the other memory cells, and the relationship in magnitude of the write current threshold between the memory cells may be inverted. However, each of the semiconductor memory devices disclosed in the patent references 2-4 may enter such a situation that data cannot be written correctly into the memory cell at a temperature different from the temperature at which the write current was tuned, due to variations in temperature dependence of the write current threshold among the memory cells. Thus, the structures disclosed in the patent references 2-4 suffer from a problem that the structure cannot deal with the variations in temperature dependence of the write current threshold among the memory cells.

SUMMARY OF THE INVENTION

An object of the invention is to provide a semiconductor integrated circuit device that can deal with variations in temperature dependence of the write current threshold in each memory cell.

A semiconductor integrated circuit device according to an aspect of the invention includes a plurality of memory cells storing data; a write current line arranged near the memory cells or electrically connected to the memory cells; a first constant current generating circuit providing an output current having a temperature dependence; a second constant current generating circuit providing an output current having a temperature dependence different from that of the output current of the first constant current generating circuit; a mixing circuit mixing the output currents of the first and second constant current generating circuits together to provide a composite current at a variable mixing rate; and a write circuit electrically connected to the write current line, and writing data into the memory cell by passing a write current through the write current line based on the composite current provided by the mixing circuit.

The invention can deal with the variations in temperature dependence of the write current threshold among the memory cells.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
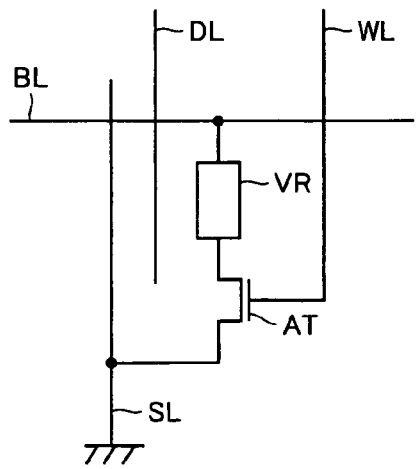
FIG. 1 shows an electrically equivalent circuit of a memory cell MC.

Embodiments of the invention will now be described with reference to the drawings. In the drawings, the same or corresponding portions bear the same reference numbers, and description thereof is not repeated.

First Embodiment

FIG. 1 shows an electrically equivalent circuit of a memory cell MC. Referring to FIG. 1, memory cell MC includes a magneto-resistance element VR and an N-channel MOS transistor (access transistor) AT.

Magneto-resistance element VR is, e.g., a TMR element, is connected in series between a bit line (write current line) BL and a source line SL, is electromagnetically coupled to a digit line (write current line) DL, and has an end electrically connected to bit line BL. One of conductive terminals of access transistor AT is electrically connected to the other end of magneto-resistance element VR, and the other conductive terminal is electrically connected to source line SL. A control gate of access transistor AT is electrically connected to a word line WL. Memory cells MC are arranged in rows and columns in the memory cell array. In the following description, the direction of extension of bit line BL is referred to as a "column direction", and the direction of extension of word line WL and digit line DL is referred to as a "row direction".

In the data write operation, a write current IWBL is passed through bit line BL, and a write current IWDL is passed through digit line DL. Write current IWBL generates an easy axis magnetic field that is a magnetic field in a direction of an easy axis EX of magneto-resistance element VR, and write current IWDL generates a hard axis magnetic field that is a magnetic field in a direction of a hard axis HX of magneto-resistance element VR. A composite magnetic field formed of the easy and hard axis magnetic fields generated by write currents IWBL and IWDL changes the directions of the magnetic field moments of upper and lower magnetic thin films in magneto-resistance element VR so that the resistance value of magneto-resistance element VR changes.

In the data read operation, access transistor AT is turned on, and the data stored in memory cell MC is detected according to a current quantity of a read current IR flowing through bit line BL and source line SL.

Figure 2:
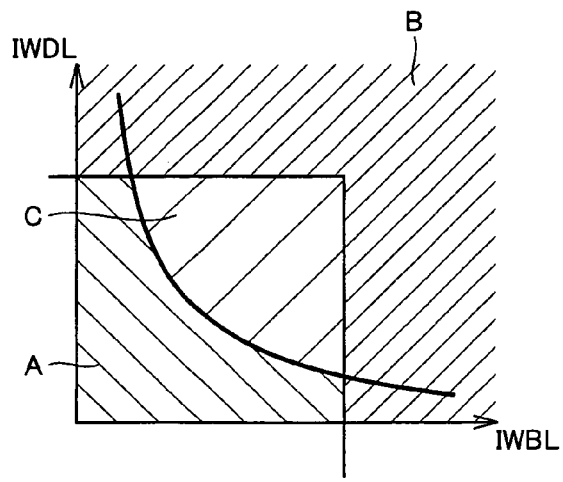
FIG. 2 illustrates an astroid curve of memory cell MC.

FIG. 2 illustrates an astroid curve of memory cell MC.

Referring to FIG. 2, the astroid curve represents the thresholds of write currents IWBL and IWDL. More specifically, in a region under the astroid curve, write currents IWBL and IWDL are insufficient and lower than the threshold so that data is not written into the memory cell. In a region above the astroid curve, write currents IWBL and IWDL exceed the threshold so that data is written into the memory cell. In a region B extending above and below the astroid curve, at least one of write currents IWBL and IWDL is excessively large so that data stored in a memory cell other than the write target is changed by rewriting. Thus, the write current is insufficient in a region A, the write current is excessive in region B and the current is effective as the write current of the memory cell in region C.

Figure 3:
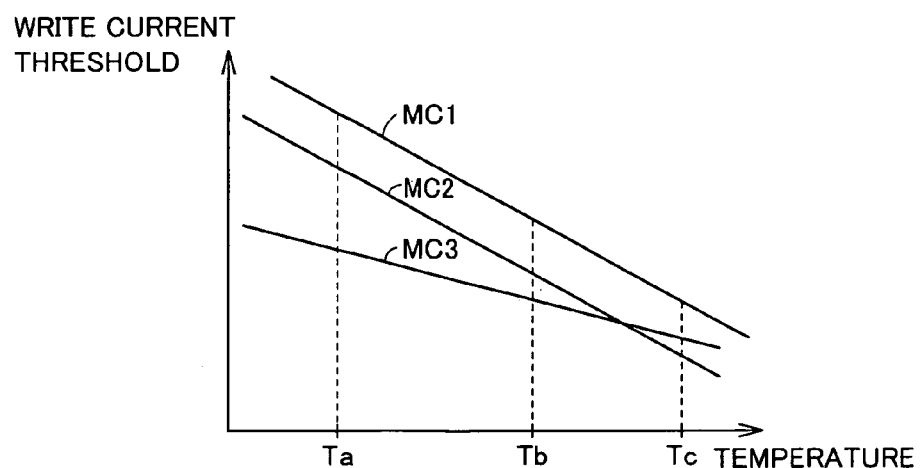
FIG. 3 is a graph illustrating a temperature dependence of write current thresholds of memory cells MC.

FIG. 3 is a graph representing a temperature dependence of the write current threshold among memory cells MC.

Referring to FIG. 3, MC1-MC3 represent the write current thresholds of different memory cells MC1-MC3, respectively. Memory cells MC1-MC3 have different temperature dependences, respectively. At a temperature Ta, variations are present in write current threshold among the memory cells, and the degree of these variations is different from that at a temperature Tb. At a temperature Tc, the relationship in magnitude of the write current threshold between the memory cell MC2 and MC3 is opposite to those at temperatures Ta and Tb.

Figure 4:
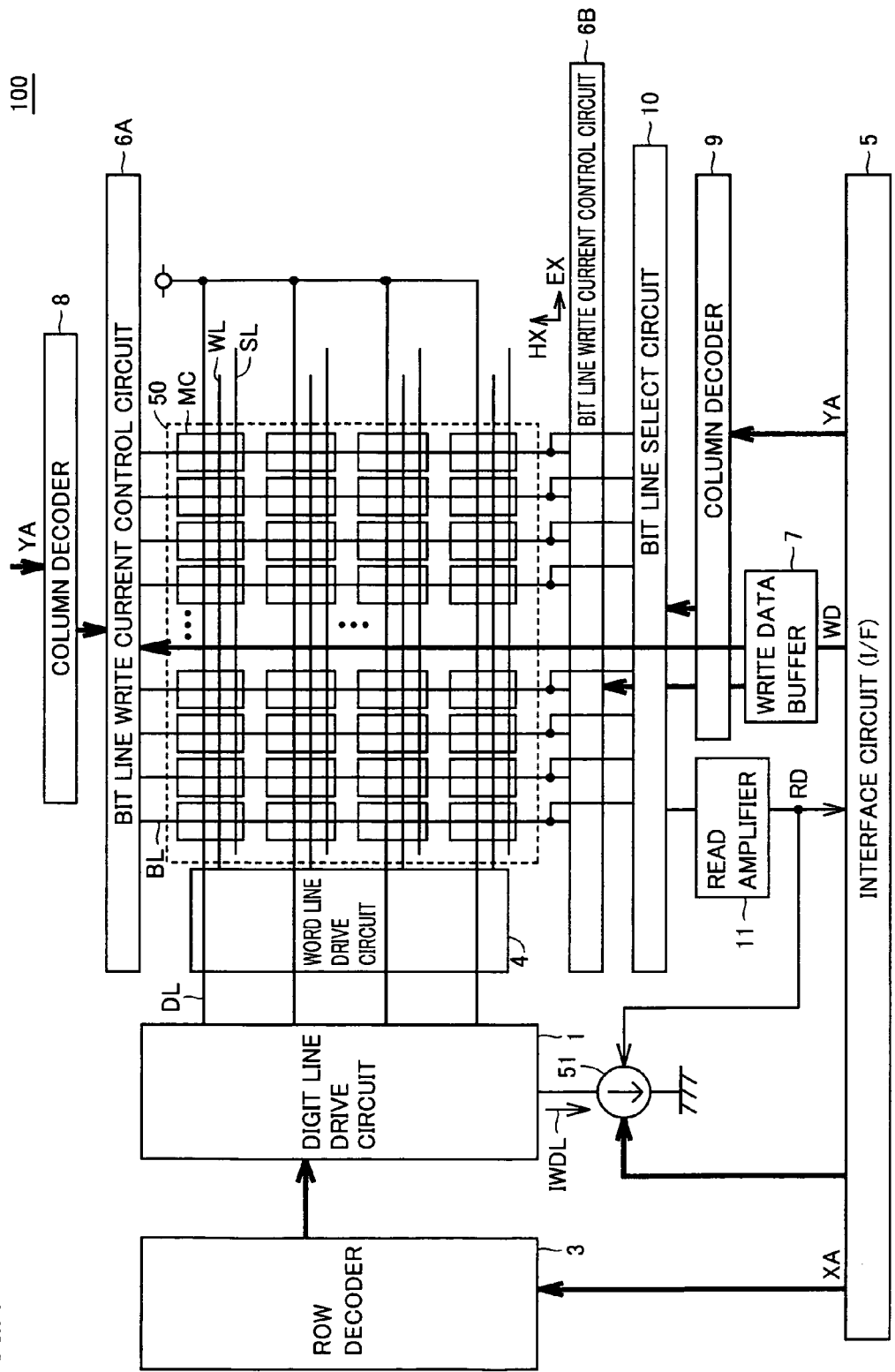
FIG. 4 schematically shows a whole structure of a semiconductor integrated circuit device according to a first embodiment of the invention.

FIG. 4 schematically shows a whole structure of the semiconductor integrated circuit device according to the first embodiment of the invention.

Referring to FIG. 4, a semiconductor integrated circuit device 100 includes a memory cell array 50 including a plurality of memory cells MC arranged in rows and columns, a digit line drive circuit 1, a row decoder 3, a word line drive circuit 4, an interface (I/F) circuit 5, bit line write current control circuits 6A and 6B, a write data buffer 7, a column decoder 8, a column decoder 9, a bit line select circuit 10, a read amplifier 11 and a constant current generating portion 51.

Digit line drive circuit 1, row decoder 3, bit line write current control circuits 6A and 6B, write data buffer 7 and column decoder 8 form a write circuit 52. Column decoder 9, bit line select circuit 10 and read amplifier 11 form a read circuit 53.

A semiconductor integrated circuit device 100 includes bit lines BL arranged corresponding to the respective columns in memory cell array 50 as well as digit lines DL, word lines WL and source lines SL that are arranged corresponding to the respective rows in memory cell array 50.

Magneto-resistance element VR included in memory cell MC is arranged such that hard axis HX extends in the extension direction of bit line BL, and easy axis EX extends in a direction perpendicular to bit line BL. Word lines WL and source lines SL are arranged in the direction of easy axis EX.

Row decoder 3 decodes an X-address signal XA received via interface circuit 5 to produce a row select signal designating a selected row. Column decoders 8 and 9 decode a Y-address signal YA received via interface circuit 5 to produce a column select signal designating the selected column.

Digit line drive circuit 1 is arranged on one side of digit line DL, and the other side of digit line DL is connected to a power supply potential. In a data write operation, digit line drive circuit 1 supplies write current IWDL to digit line DL arranged corresponding to the selected row based on the row select signal received from row decoder 3. In the data write operation, therefore, write current IWDL flows through digit line DL from the power supply potential toward digit line drive circuit 1 independently of the logical level of the write data.

In a data read operation, word line drive circuit 4 drives word line WL arranged corresponding to the selected row to the selected state based on the row select signal provided from row decoder 3. For the sake of simplicity, FIG. 4 does not show a path of the row select signal flowing from row decoder 3 to word line drive circuit 4.

Bit line write current control circuits 6A and 6B are arranged on the opposite sides of bit line BL, respectively. Write data buffer 7 provides mutually complementary write data to bit line write current control circuits 6A and 6B based on data WD externally received via interface circuit 5.

In the data write operation, bit line write current control circuits 6A and 6B supply write current IWBL to bit line BL corresponding to the selected column in a direction corresponding to the logical level of the write data received from write data buffer 7 based on the column select signal received from column decoder 8. Bit line write current control circuits 6A and 6B receive the column select signal from column decoder 8 via column select signal lines arranged on memory cell array 50. For the sake of simplicity, a path of the column select signal transmitted to bit line write current control circuit 6B is not shown.

Owing to such configurations that bit line write current control circuits 6A and 6B are arranged on the opposite sides of bit lines BL, respectively, and write data buffer 7 provides the mutually complementary write data, write current IWBL can flow in the direction corresponding to the logical level of the write data through bit line BL corresponding to the selected column.

Further, bit line select circuit 10 that selects the bit line based on the column select signal provided from column decoder 9 is arranged for bit line BL. In the data read operation, bit line select circuit 10 selects bit line BL corresponding to the selected column, and connects it to read amplifier 11.

Read amplifier 11 detects read current IR flowing through bit line BL and source line SL, and externally provides, as read data, internal read data RD produced based on a result of the detection via interface circuit 5.

Interface circuit 5 is arranged for achieving matching or consistency in signal specification with external devices, and includes an input/output buffer.

Figure 5:
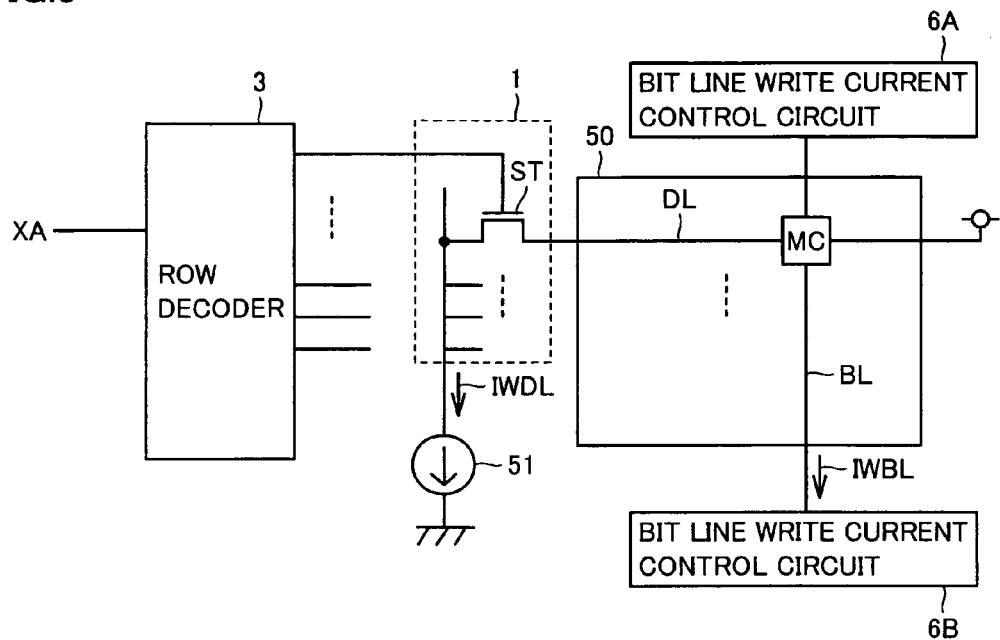
FIG. 5 illustrates a data write operation of a digit line drive circuit, a constant current generating portion and the like in the semiconductor integrated circuit device according to the first embodiment of the invention.

FIG. 5 illustrates a data write operation performed by the digit line drive circuit, constant current generating circuit and others in the semiconductor integrated circuit device according to the first embodiment of the invention. Referring to FIG. 5, digit line drive circuit 1 includes a plurality of select transistors ST.

Select transistors ST are arranged corresponding to digit lines DL, respectively. Select transistor ST corresponding to the selected row is turned on based on the row select signal provided from row decoder 3.

Constant current generating portion 51 supplies write current IWDL to digit line DL corresponding to select transistor ST in the on state.

Figure 6:
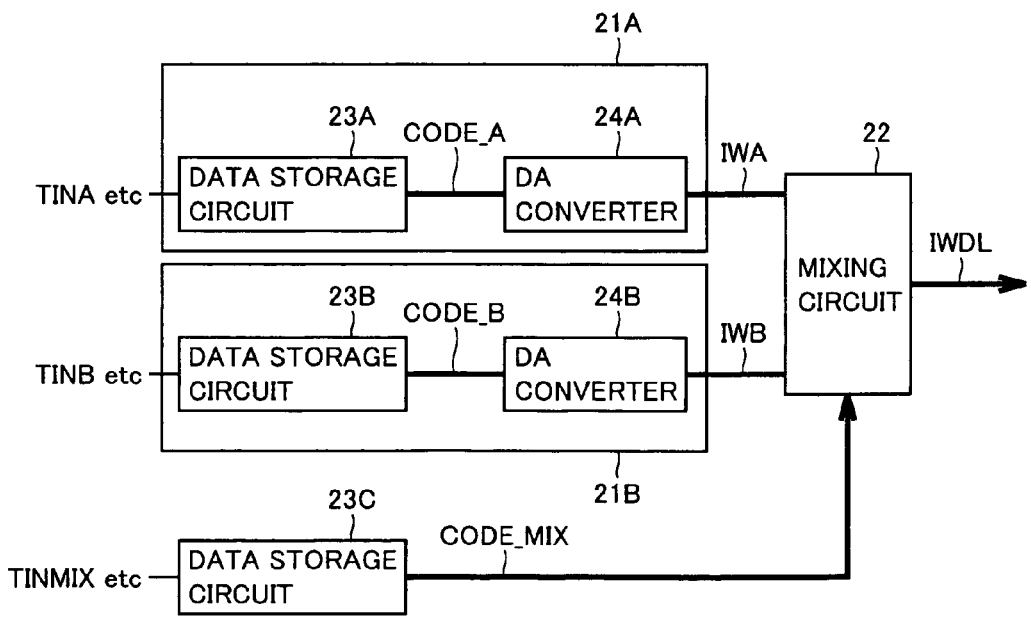
FIG. 6 is a function block diagram illustrating the constant current generating portion in the semiconductor integrated circuit device according to the first embodiment of the invention.

FIG. 6 is a function block diagram illustrating a structure of a constant current generating portion in the semiconductor integrated circuit device according to the first embodiment of the invention.

Referring to FIG. 6, constant current generating portion 51 includes a (first) constant current generating circuit 21A, a (second) constant current generating circuit 21B, a mixing circuit 22 and a data storage circuit 23C. Constant current generating circuit 21A includes a data storage circuit 23A and a DA (Digital to Analog) converter 24A. Constant current generating circuit 21B includes a data storage circuit 23B and a DA (Digital to Analog) converter 24B.

DA converter 24A supplies a current IWA to mixing circuit 22 based on a set value CODE_A (first set value) stored in data storage circuit 23A. DA converter 24B supplies a current IWB to mixing circuit 22 based on a set value CODE_B (second set value) stored in data storage circuit 23B. Currents IWA and IWB have temperature dependences. The temperature dependences of currents IWA and IWB are different from each other.

Mixing circuit 22 changes its combination or mixing rate based on a set value CODE_MIX stored in data storage circuit 23C. Mixing circuit 22 mixes currents IWA and IWB at the mixing rate corresponding to set value CODE_MIX, and provides the composite current prepared by this mixing as write current IWDL.

The semiconductor integrated circuit device according to the first embodiment of the invention stores the set values of current IWA, current IWB and the mixing rate, semiconductor integrated circuit device 100 can internally store various set values obtained by a tuning test to be described later, and semiconductor integrated circuit device 100 can deal with the variations of itself. Thus, a device for employing semiconductor integrated circuit device 100 is not required to have a structure dealing with variations of it.

Although digit line drive circuit 1 supplies the output current of mixing circuit 22 as write current IWDL to digit line DL, it may be configured to supply write current IWDL to digit line DL based on the output current of mixing circuit 22. For example, digit line drive circuit 1 may be configured to amplify the output current of mixing circuit 22 and to provide, as write current IWDL, the current having double the current value of the output current of mixing circuit 22.

Figure 7:
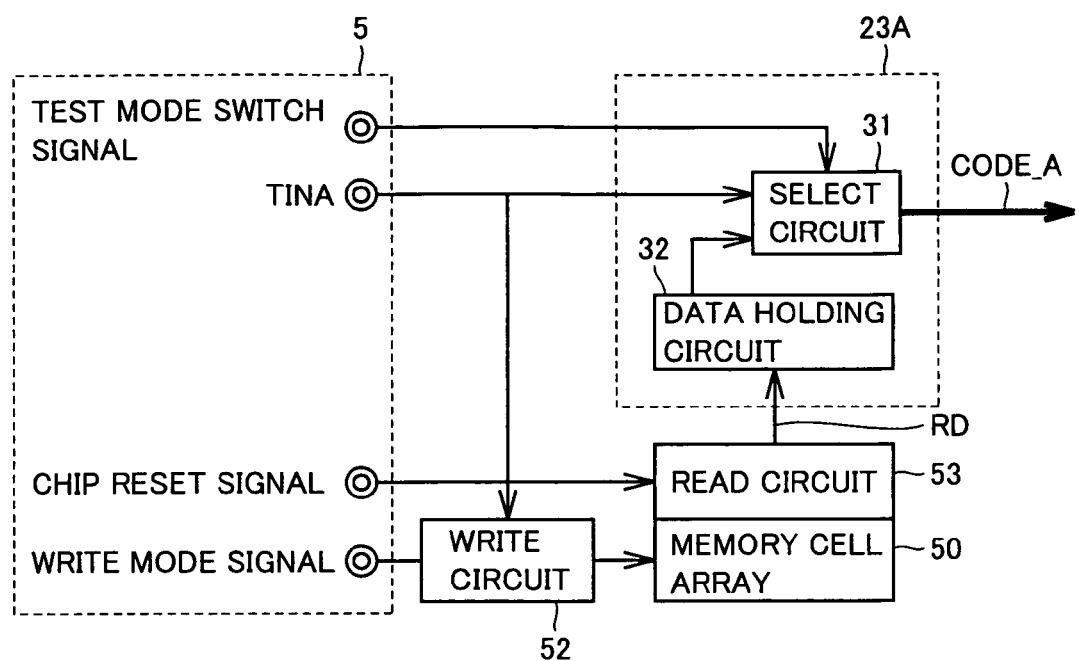
FIG. 7 is a function block diagram illustrating a structure of a data storage circuit and a structure storing set values in the data storage circuit in the semiconductor integrated circuit device according to the first embodiment of the invention.

FIG. 7 is a functional block diagram illustrating a structure of the data storage circuit in the semiconductor integrated circuit device according to the first embodiment of the invention as well as a structure storing the set values in the data storage circuit.

Referring to FIG. 7, data storage circuit 23A includes a select circuit 31 and a data holding circuit 32.

First, description will now be given on an operation of data storage circuit 23A during the tuning test of write current IWDL. In this case, a test mode switch signal indicative of the tuning test operation as well as a test signal TINA are provided from a test device (not shown) outside semiconductor integrated circuit device 100 via interface circuit 5.

When the test mode switch signal indicates the tuning test operation, select circuit 31 sets test signal TINA to set value CODE_A, and provides it to DA converter 24A. Such a structure may be employed that test mode switch signal, test signal TINA and test signals TINB and TINC to be described later are received via general-purpose terminals of semiconductor integrated circuit device 100, or that these signals are received via input/output terminals for reading/writing data from/into memory cells MC.

When the tuning test ends, the test device (not shown) changes the write mode signal from the disable logic to the enable logic, and provides it via interface circuit 5 to write circuit 52.

Write circuit 52 receiving the write mode signal of the enable logic writes test signal TINA that is provided from the test device (not shown) and corresponds to the tuning test result in memory cell MC employed for storing the set value. The memory cell MC for such set value storage is one or more among the plurality of memory cells MC included in memory cell array 50.

Then, the operation of data storage circuit 23A in the normal state will be described. In this case, the test mode switch signal indicative of the normal state is externally received.

When semiconductor integrated circuit device is powered on, it externally receives a chip reset signal.

Read circuit 53 performs data reading on the memory cell MC for the set value storage according to rising or falling timing of the chip reset signal received via interface circuit 5, and provides internal read data RD to data holding circuit 32.

Data holding circuit 32 holds internal read data RD received from read circuit 53, and also provides it to select circuit 31.

When the test mode switch signal received via interface circuit 5 indicates the normal state, select circuit 31 sets internal read data RD received from data holding circuit 32 to set value CODE_A, and provides it to DA converter 24A.

Data storage circuits 23B and 23C have substantially the same structure as data storage circuit 23A except for that test signal TINA is replaced with test signals TINB or TINC, and set value CODE_A is replaced with set value CODE_B or CODE_C. Therefore, detailed description thereof is not repeated.

Owing to the structure in which memory cell array 50 includes memory cells MC for the set value storage, it is not necessary to employ a circuit nonvolatilely storing data other than memory cell array 50, and increase in scale of semiconductor integrated circuit device 100 and complication of control can be prevented.

Owing to the structure in which data holding circuit 32 holds the set value, it is not necessary to read the set value from memory cell MC employed for the set value storage in response to every data writing into memory cell MC, and the data write speed can be improved. In particular, this effect of improving the data write speed becomes significant in the semiconductor integrated circuit device such as an MRAM in which the data writing into the memory cell takes a considerably longer time than the reading from a data holding circuit such as a register.

Figure 8:
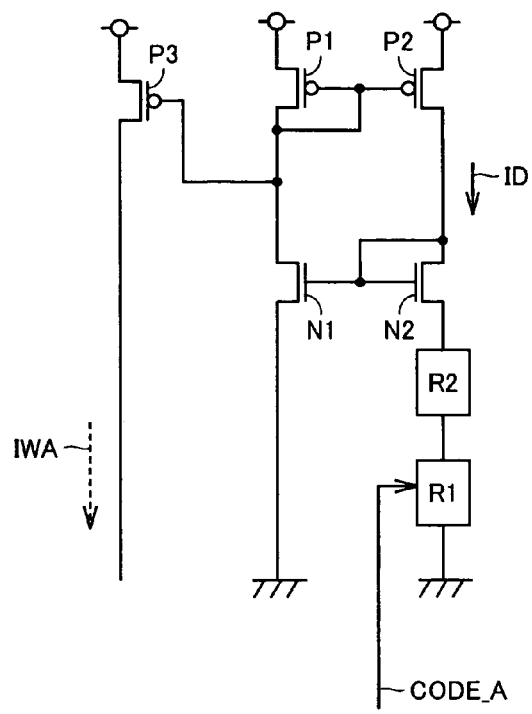
FIG. 8 is a schematic circuit diagram illustrating a structure of a DA converter in the semiconductor integrated circuit device according to the first embodiment of the invention.

FIG. 8 is a schematic circuit diagram illustrating a structure of the DA converter in the semiconductor integrated circuit device according to the first embodiment of the invention.

Referring to FIG. 8, DA converter 24A includes N-channel MOS transistors N1 and N2, P-channel MOS transistor P1-P3, a variable resistance (first resistance) R1 and a fixed resistance (second resistance) R2.

P-channel MOS transistor P1 has a drain connected to gates of P-channel MOS transistors P1-P3 and a drain of N-channel MOS transistor N1.

P-channel MOS transistor P2 has a drain connected to the drain and gate of N-channel MOS transistor N2 as well as a gate of N-channel MOS transistor N1.

N-channel MOS transistor N2 has a source connected to fixed resistance R2 and variable resistance R1 in series.

P-channel MOS transistors P1-P3 have sources connected to a power supply potential. A ground potential is connected to a source of N-channel MOS transistor N1 and one end of variable resistance R1.

Fixed resistance R2 is a resistor having a temperature dependence, and thus has a resistance value varying with a temperature. Variable resistance R1 has a resistance value that is variable based on set value CODE_A received from data storage circuit 23A.

The current value of a drain current ID of P- and N-channel MOS transistors P2 and N2 depends on the resistance values of variable and fixed resistances R1 and R2. More specifically, drain current ID has a temperature dependence corresponding to the temperature dependence of fixed resistance R2, and the current value of drain current ID can be changed by changing set value CODE_A.

Since N-channel MOS transistors N1 and N2 as well as P-channel MOS transistors P1-P3 form a current mirror circuit, a current having substantially the same current value as drain current ID becomes a drain current of P-channel MOS transistor P3, i.e., current IWA.

DA converter 24B has substantially the same structure as DA converter 24A except for that current IWA and set value CODE_A are replaced with current IWB and set value CODE_B, respectively. Therefore, description thereof is not repeated.

In the semiconductor integrated circuit device according to the first embodiment of the invention, DA converter 24A has fixed resistance R2, e.g., having a negative temperature dependence, and DA converter 24B has fixed resistance R2, e.g., having a positive temperature dependence.

Figure 9A:
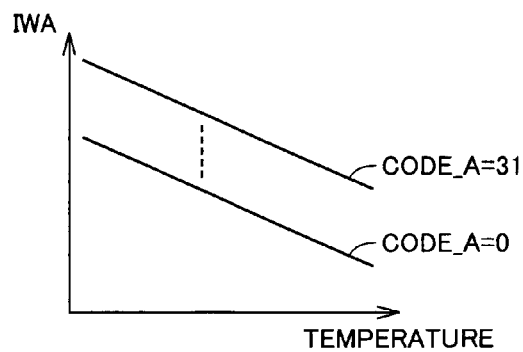
FIGS. 9A and 9B are graphs illustrating characteristics of currents IWA and IWB, respectively.
Figure 9B:
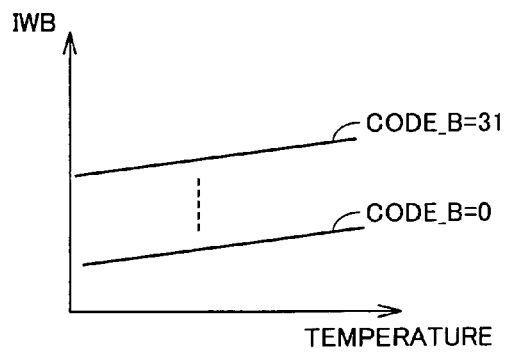

FIGS. 9A and 9B are graphs illustrating characteristics of currents IWA and IWB, respectively.

Referring to FIGS. 9A and 9B, output current IWA of constant current generating circuit 21A has a negative temperature dependence, and the current value of current IWA can be selectively changed to thirty-two levels by changing set value CODE_A between 0 and 31 inclusive. Output current IWB of constant current generating circuit 21B has a positive temperature dependence, and the current value of current IWB can be selectively changed to thirty-two levels by changing set value CODE_B between 0 and 31 inclusive.

Figure 10:
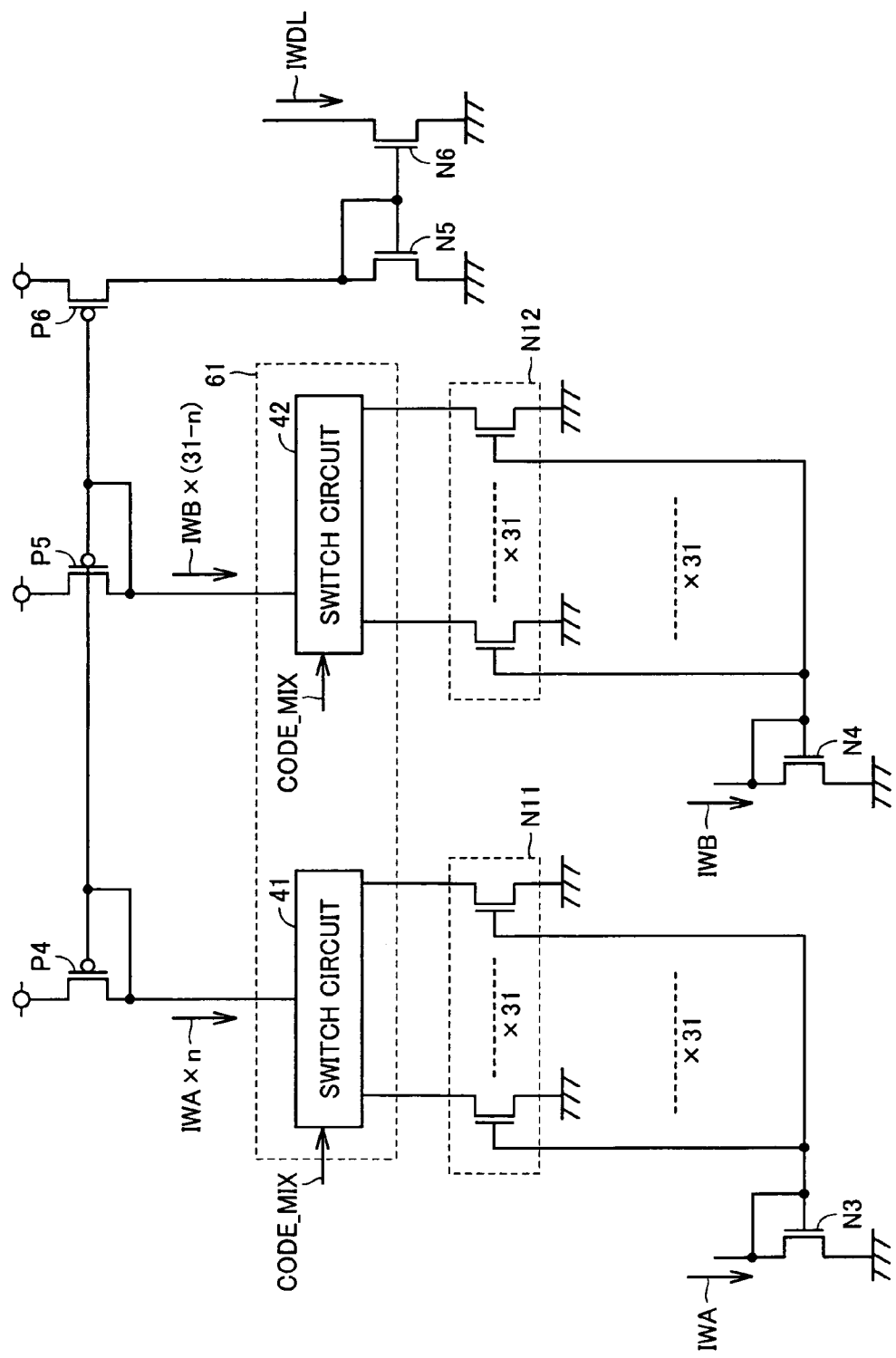
FIG. 10 is a circuit diagram illustrating a structure of a mixing circuit 22 of the semiconductor integrated circuit device according to the first embodiment of the invention.

FIG. 10 is a circuit diagram illustrating a structure of mixing circuit 22 in the semiconductor integrated circuit device according to the first embodiment of the invention.

Referring to FIG. 10, mixing circuit 22 includes N-channel MOS transistors N3-N6, P-channel MOS transistors P4-P6, N-channel MOS transistor portions N11 and N12, and a switch circuit portion 61 which includes switch circuits 41 and 42.

N-channel MOS transistor N3 has a drain connected to a drain of P-channel MOS transistor P3 in DA converter 24A. More specifically, output current IWA of DA converter 24A forms a drain current of N-channel MOS transistor N3.

N-channel MOS transistor portion N11 includes, e.g., thirty-one N-channel MOS transistors (first transistors), each of which forms a current mirror circuit together with N-channel MOS transistor N3. More specifically, each N-channel MOS transistor provides a current corresponding to output current IWA of DA converter 24A such as a current of the same current value as current IWA.

N-channel MOS transistor N4 has a drain connected to a drain of P-channel MOS transistor P3 in DA converter 24B. Thus, output current IWB of DA converter 24B forms the drain current of N-channel MOS transistor N4.

N-channel MOS transistor portion N12 includes, e.g., thirty-one N-channel MOS transistors (second transistors), each of which forms a current mirror circuit together with N-channel MOS transistor N4. More specifically, each N-channel MOS transistor provides a current corresponding to output current IWB of DA converter 24B such as a current of the same current value as current IWB.

Switch circuit portion 61 selects thirty-one MOS transistors in total included N-channel MOS transistor portions N11 and N12 based on set value CODE_MIX received from data storage circuit 23C, and connects the outputs of the selected thirty-one N-channel MOS transistors in parallel.

More specifically, when set value CODE_MIX received from data storage circuit 23C is equal to n (which is a natural from 0 to 31 inclusive), switch circuit 41 selects the N-channel MOS transistors of n in number included in N-channel MOS transistor portion N11, and connects the drains of the selected N-channel MOS transistors to the drain of P-channel MOS transistor P4. Based on set value CODE_MIX received from data storage circuit 23C, switch circuit 42 selects the N-channel MOS transistors of (31−n) in number included in N-channel MOS transistor portion N12, and connects the drains of the selected N-channel MOS transistors to the drain of P-channel MOS transistor P5.

P-channel MOS transistor P6 forms a current mirror circuit together with P-channel MOS transistors P4 and P5, and provides a current corresponding to the composite current of the output currents of the N-channel MOS transistors selected by switch circuits 41 and 42 to the drain of N-channel MOS transistor N5.

N-channel MOS transistors N5 and N6 form a current mirror circuit, and N-channel MOS transistor N6 provides a current corresponding to the output current of P-channel MOS transistor P6 as write current IWDL.

Figure 11:
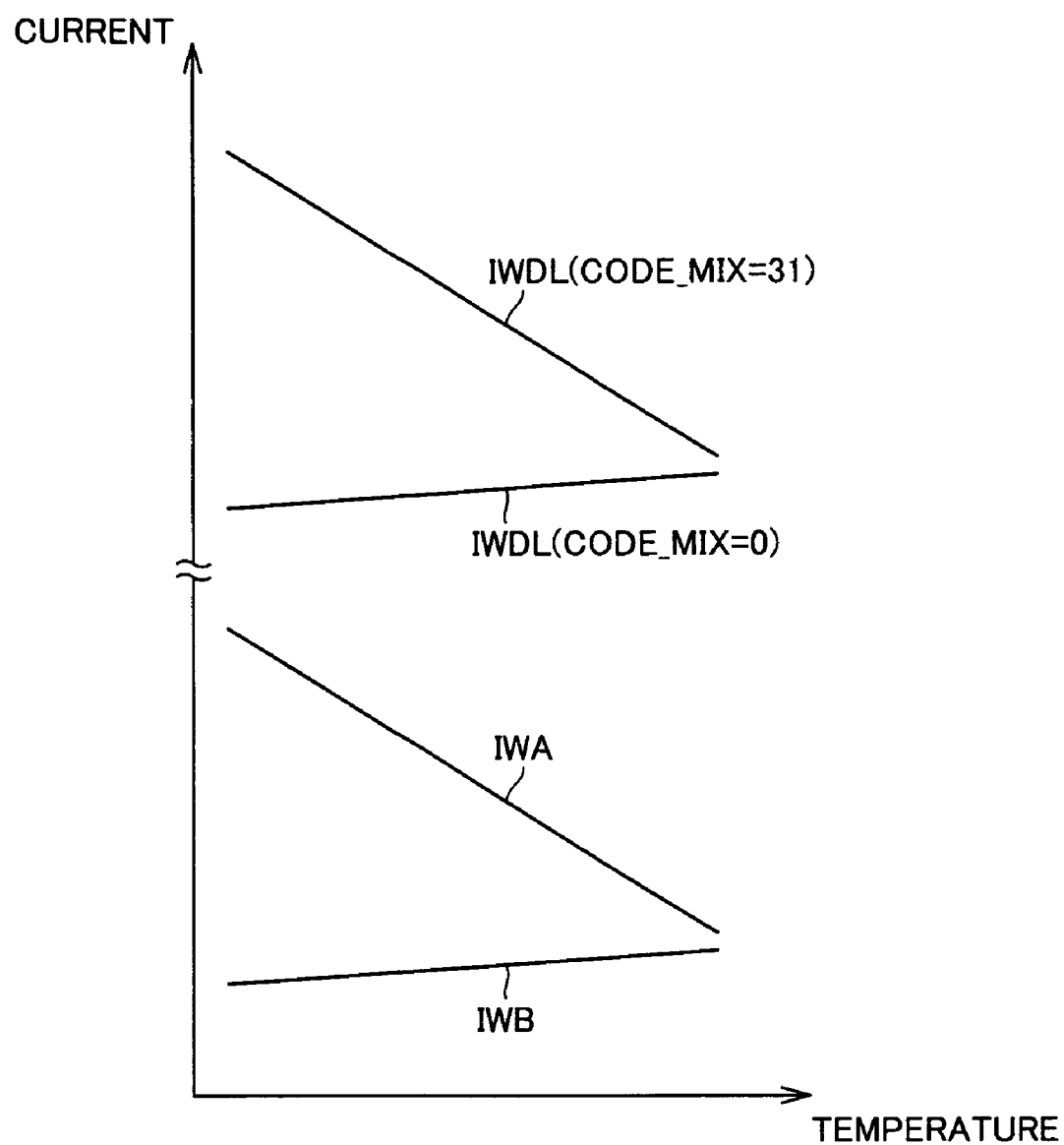
FIG. 11 is a graph illustrating characteristics of a write current IWDL.

FIG. 11 is a graph illustrating characteristics of write current IWDL.

Referring to FIG. 11, it is assumed that write current IWDL has a current value of IWDL, output current IWA of DA converter 24A has a current value of IWA, output current IWB of DA converter 24B has a current value of IWB and set value CODE_MIX received from data storage circuit 23C is equal to n (which is a natural number from 0 to 31 inclusive), in which case IDWL is represented by the following equation:

$$IWDL = n \times IWA + (31-n) \times IWB \quad (1)$$

When n is equal to 31, IWDL is equal to (31×IWA) according to the equation (1). Thus the current value of write current IWDL is thirty-one times large than that of current IWA, and write current IWDL has the same temperature characteristics as current IWA.

When n is equal to 0, IWDL is equal to (31×IWB) according to the equation (1). Thus the current value of write current IWDL is thirty-one times large than that of current IWB, and write current IWDL has the same temperature characteristics as current IWB.

In the case of ($1 \leq n \leq 30$), the temperature dependence of write current IWDL changes according to the rate between IWA and IWB in the equation (1), and the temperature dependence of write current IWDL is represented by a graph having a gradient between those of the temperature dependences of currents IWA and IWB.

Accordingly, by changing set value CODE_MIX, the mixing rate between currents IWA and IWB in mixing circuit 22 is changed, and the temperature dependence of write current IWDL can be arbitrarily set in a range between the gradients of currents IWA and IWB.

Although each of N-channel MOS transistor portions N11 and N12 includes thirty-one N-channel MOS transistors, each of N-channel MOS transistor portions N11 and N12 is merely required to include the N-channel MOS transistors of two or more in number, whereby write current IWDL can selectively have three or more kinds of temperature dependences according to the equation (1) so that the object of the invention can be achieved.

Figure 12:
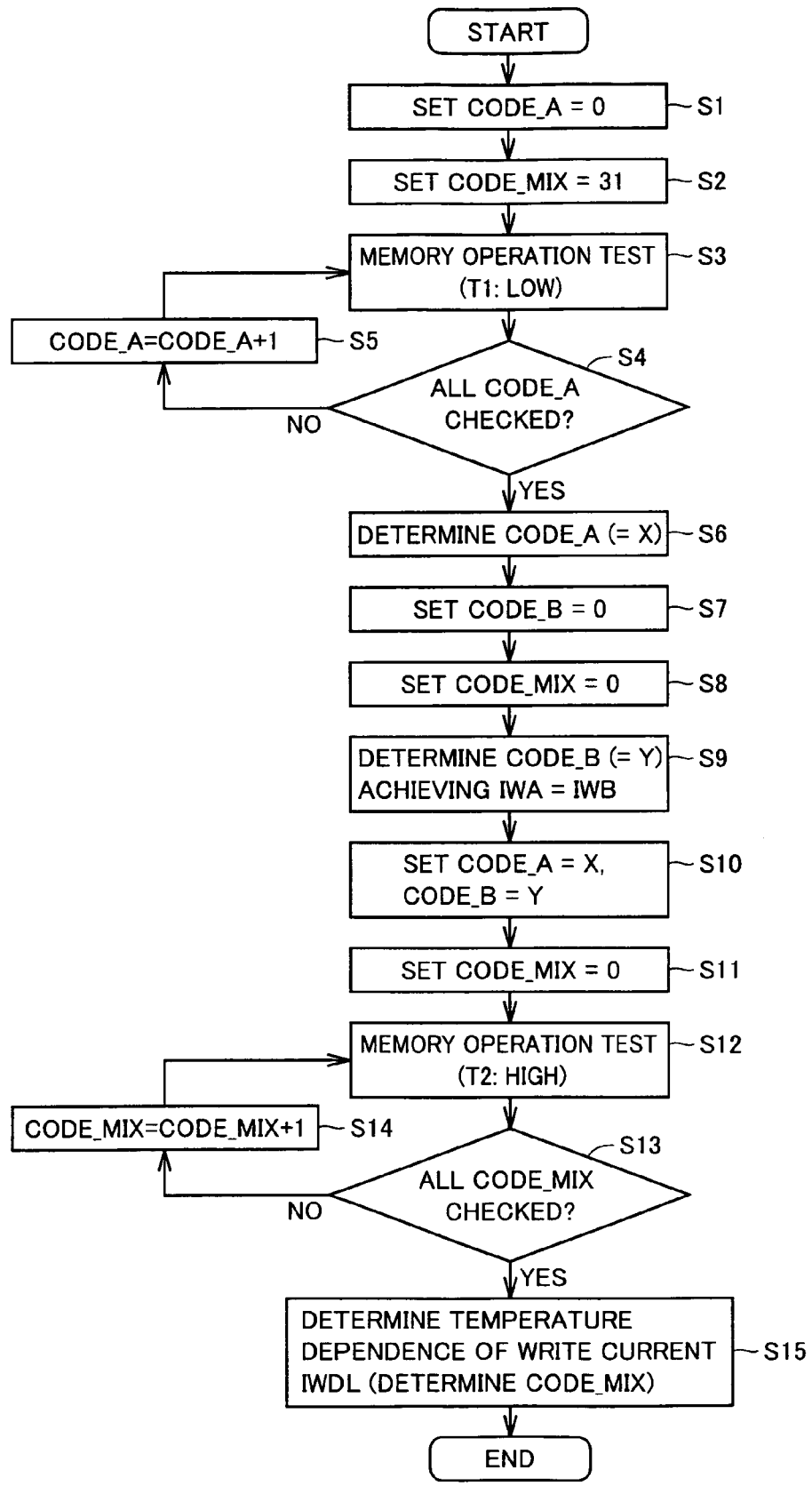
FIG. 12 is a flowchart illustrating tuning test steps for the write current in the semiconductor integrated circuit device according to the first embodiment of the invention.

FIG. 12 is a flowchart defining tuning test steps for the write current in the semiconductor integrated circuit device according to the first embodiment of the invention.

A test device (not shown) provides a test mode switch signal indicative of the tuning test operation to semiconductor integrated circuit device 100. The test device provides test signal TINA indicative of 0 and test signal TINC indicative of 31 to semiconductor integrated circuit device 100.

Since the test mode switch signal received via interface circuit 5 indicates the tuning test operation, select circuit 31 in data storage circuit 23A provides 0 indicated by test signal TINA received via interface circuit 5 to DA converter 24A as set value CODE_A (S1).

DA converter 24A provides current IWA corresponding to set value CODE_A equal to 0.

Since the test mode switch signal received via interface circuit 5 indicates the tuning test operation, select circuit 31 in data storage circuit 23C provides 31 indicated by test signal TINC received via interface circuit 5 to mixing circuit 22 as set value CODE_MIX (S2).

Since set value CODE_MIX is 31, mixing circuit 22 provides, as write current IWDL, a current that has a current value thirty-one times larger than that of current IWA provided from DA converter 24A and has the same temperature dependence as current IWA. In the data write operation, write current IWDL is supplied to digit line DL corresponding to the selected row. This structure can achieve a state in which write current IWDL depends on only output current IWA of constant current generating circuit 21A.

Then, the test device performs the memory operation test under the condition of a temperature T1 (first temperature).

More specifically, the test device controls write and read circuits 52 and 53, and determines the current value (first write current value) of write current IWDL to be passed through digit line DL for correctly writing data into memory cell MC at temperature T1 (S3).

More specifically, the test device changes the write mode signal from the disable logic to the enable logic, and provides it via interface circuit 5 to write current 52. The test device selects one write target memory cell MC from memory cell array 50, and provides an address signal indicative of selected memory cell MC to write circuit 52 via interface circuit 5. The test device provides write test data (i.e., data for a write test) to write circuit 52 via interface circuit 5.

Write circuit 52 receives the write mode signal of the enable logic, and writes the write test data into the write target memory cell.

Then, the test device controls read circuit 53 to read data from all memory cells MC in memory cell array 50.

The test device checks whether the data writing is correctly performed or not, i.e., whether such a situation is achieved or not that the write test data can be read from the write target memory cell MC and the data held in memory cells MC other than the write target is not changed by erroneous rewriting.

The test device performs the above checking on all memory cells MC included in memory cell array 50, handling them as write target memory cells MC, and determines that 0 can be used as set value CODE_A when it is confirmed that the data writing can be correctly performed on all memory cells MC. Conversely, when the test device confirms that the data writing cannot be performed correctly when at least one of the memory cells MC is handled as the write target, the test device determines that 0 cannot be used as set value CODE_A. Owing to this structure, it is possible to obtain the optimum set value corresponding to the variations in all memory cells MC included in memory cell array 50.

When the test device has not conducted the memory operation test on all the possible values of set value CODE_A (NO in S4), it adds one to set value CODE_A (S5), and conducts the memory operation test again (S3).

When the test device has conducted the memory operation test on all the possible values of set value CODE_A (YES in S4), it selects one set value CODE_A from among available values (S6). In the following description, selected set value CODE_A is handled as X.

The test device measures current IWA provided from constant current generating circuit 21A corresponding to selected set value CODE_A. For example, constant current generating circuit 21A externally provides current IWA from the terminal of semiconductor integrated circuit device 100, and thereby the test device measures current IWA.

Figure 13:
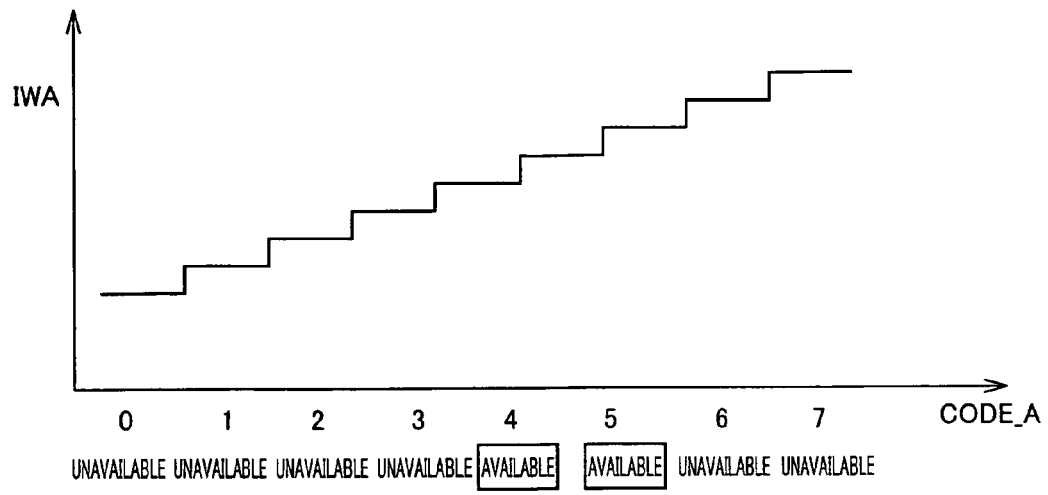
FIG. 13 is a graph illustrating, by way of example, a relationship between a set value CODE_A and current IWA as well as a result of a memory operation test.

FIG. 13 is a graph illustrating, by of example, a relationship between set value CODE_A and current IWA as well as a result of the memory operation test.

Referring to FIG. 13, output current IWA of constant current generating circuit 21A is proportional to set value CODE_A. When set value CODE_A is from 0 to 3, write currents IWBL and IWDL are insufficient to exceed the threshold. This situation corresponds to region A in FIG. 2, and therefore the write test data cannot be written into write target memory cell MC. Therefore, the test device determines that set value CODE_A from 0 to 3 is unavailable.

When set value CODE_A is 6 or more, at least one of write currents IWBL and IWDL is excessively large. Since this situation corresponds to region B in FIG. 2, the data stored in the memory cell other than the write target is changed by rewriting. Therefore, the test device determines that set value CODE_A of six or more is unavailable.

When set value CODE_A is from 4 to 5, this situation corresponds to region C in FIG. 2 so that the write test data cannot be written into memory cell MC of the write target, and the data stored in memory cell MC other than the write target is not changed by rewriting. Therefore, the test device determines that 4 and 5 are available as set value CODE_A.

In this case, the test device selects set value CODE_A of 4 or 5 that is determined as the available value. When three or more specific values are determined as available set value CODE_A, it is preferable that the test device selects the value at or near the middle in the available range in view of various variations due to the temperature dependence and the like of the semiconductor integrated circuit device.

Referring to FIG. 12, the test device provides test signal TINB indicative of 0 and test signal TINC indicative of 0 to semiconductor integrated circuit device 100.

Since the test mode switch signal received via interface circuit 5 indicates the tuning test operation, select circuit 31 in data storage circuit 23B provides 0 that is indicated by test signal TINB received via interface circuit 5 to DA converter 24B as set value CODE_B (S7).

DA converter 24B provides current IWB corresponding to set value CODE_B equal to 0.

Since the test mode switch signal received via interface circuit 5 indicates the tuning test operation, select circuit 31 in data storage circuit 23C provides 0 that is indicated by test signal TINC received via interface circuit 5 to mixing circuit 22 as set value CODE_MIX (S8).

Since set value CODE_MIX is 0, mixing circuit 22 provides, as write current IWDL, the current that has the current value thirty-one times larger than that of current IWB provided from DA converter 24B and has the same temperature dependence as current IWB. This structure can attain such a state that write current IWDL depends on only output current IWB of constant current generating circuit 21B.

Then, the test device measures current IWB provided from constant current generating circuit 21B corresponding to test signal TINB.

Then, the test device searches for set value CODE_B that provides measured current IWB taking the same current value as output current IWA of constant current generating circuit 21A corresponding to selected set value CODE_A, while incrementing test signal TINB one by one.

The test device selects one set value CODE_B that provides the same current value as output current IWA of constant current generating circuit 21A corresponding to selected set value CODE_A (S9). In the following description, it is assumed that set value CODE_B is equal to Y.

The test device may be configured as follows. When there is no set value CODE_B that provides the same current value as output current IWA of constant current generating circuit 21A corresponding to selected set value CODE_A, the test device selects one set value CODE_B that provides a current value closest to output current IWA of constant current generating circuit 21 A corresponding to selected set value CODE_A.

The test device may be configured as follows. Similarly to the case of determining available set value CODE_A, the test device conducts the memory operation test on all the possible values of set value CODE_B, and thereby selects one set value CODE_B.

Then, the test device sets selected set values CODE_A and CODE_B in constant current generating circuits 21A and 21B, respectively. More specifically, the test device provides test signals TINA and TINB that indicate selected set values CODE_A and CODE_B, respectively, to semiconductor integrated circuit device 100 (S10).

The test device sets₀ as set value CODE_MIX in mixing circuit 22.

Then, the test device performs the memory operation test at a temperature T2 (second temperature) higher than temperature T1. More specifically, the test device controls write and read circuits 52 and 53, and determines the current value (second write current value) of write current IWDL to be passed through digit line DL for correctly writing the data into memory cell MC at temperature T2. Specifications of the memory operation test are substantially the same as those in the case of detecting available set value CODE_A, and therefore description thereof is not repeated.

The test device performs the memory operation test using every memory cell MC included in memory cell array 50 as write target memory cell MC. When the test device confirms from this test that the data writing can be correctly performed on all the memory cells MC, it determines that 0 can be used as set value CODE_MIX. Conversely, when the test device confirms that the data writing cannot be correctly performed on at least one memory cell MC used as the write target, it determines that 0 cannot be used as set value CODE_MIX (S12).

When the memory operation test is not yet performed on all possible values of set value CODE_MIX (NO in S13), one is added to current set value CODE_MIX (S14), and the memory operation test is performed again (S12).

Conversely, when the test device has completed the memory operation test on all the possible values of set value CODE_MIX (YES in S13), it selects one of available values of set value CODE_MIX (S15).

The following structure is preferable. When a plurality of values are available as set value CODE_MIX, a value at or near the middle of the available range is selected in view of various variations due to the temperature dependence and the like of the semiconductor integrated circuit device, similarly to the case of determining available set value CODE_A.

While test signals TINA-TINC indicating set values CODE_A, CODE_B and CODE_MIX are being provided to data storage circuits 23A-23C, respectively, the write mode signal is changed from the disable logic to the enable logic, and is provided to write circuit 52.

Write circuit 52 receiving the write mode signal of the enable logic writes set values CODE_A, CODE_B and CODE_MIX represented by respective test signals TINA-TINC provided from the test device into the memory cells employed for storing the set values.

Figure 14:
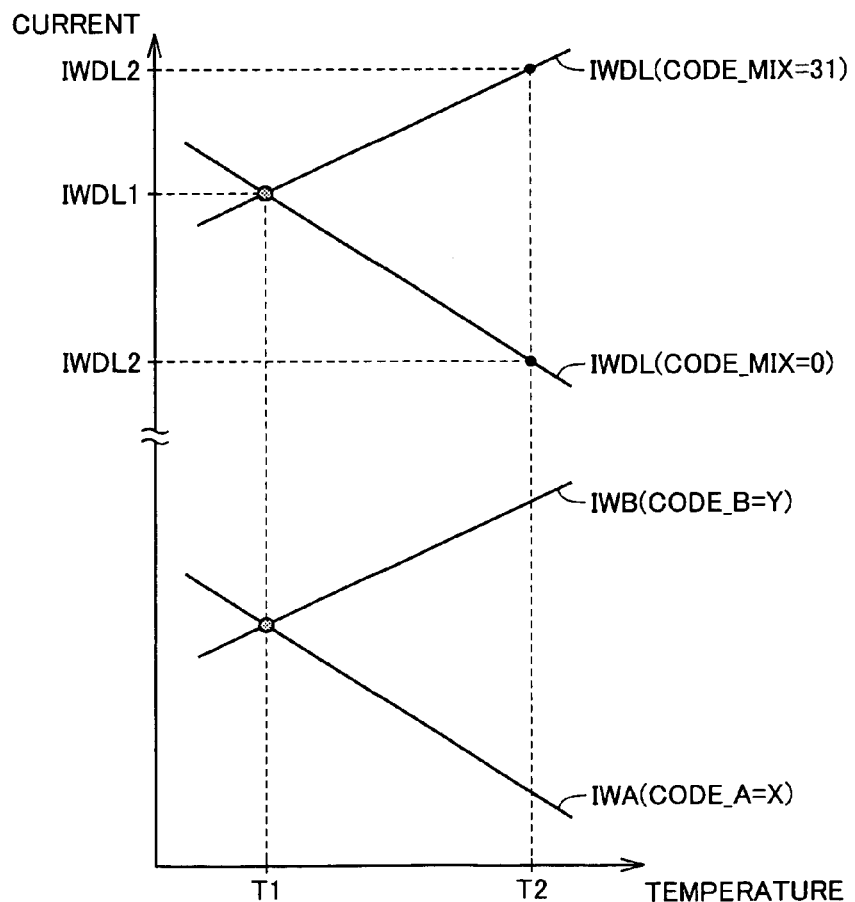
FIG. 14 illustrates characteristics of currents IWA and IWB as well as write current IWDL after the write current tuning test.

FIG. 14 illustrates characteristics of current IWA, current IWB and write current IWDL appearing after the write current tuning test.

Referring to FIG. 14, current IWA corresponding to set value CODE_A equal to X takes the same current value as current IWB corresponding to set value CODE_B equal to Y. Therefore, even when the value of n, i.e., set value CODE_MIX changes, a current value IWDL1 of write current IWDL at temperature T1 does not change, and is constant.

Since the temperature dependences of currents IWA and IWB are different from each other at temperature T2, current IWA corresponding to set value CODE_A equal to X and current IWB corresponding to set value CODE_B equal to Y take different values, respectively. Accordingly, when the value of n, i.e., set value CODE_MIX changes, a current value IWDL2 of write current IWDL at temperature T2 changes according to the equation (1).

Owing to the above structure, write current IWDL that can perform the correct data writing on memory cell MC at temperature T1 can be supplied regardless of the mixing rate of mixing circuit 22, and the mixing rate of mixing circuit 22 can be changed to allow correct writing of the data into memory cell MC at temperature T2. Therefore, write current IWDL can have the temperature dependence that allows the correct data writing on memory cell MC not only at temperature T1 but also in a range from temperature T1 to temperature T2.

The semiconductor memory devices disclosed in the patent references 2-4 cannot deal with variations in temperature dependence of the write threshold between the memory cells. However, the semiconductor integrated circuit device according to the first embodiment of the invention includes constant current generating circuits 21A and 21B having different temperature dependences, respectively, and the mixing circuit that mixes output currents IWA and IWB of constant current generating circuits 21A and 21B together at the variable mixing rate, and performs the adjustment of write current IWDL as illustrated in FIG. 12. Thereby, semiconductor integrated circuit device can provide write current IWDL having the temperature dependence that allows the correct writing of data into memory cell MC not only at a specific temperature but also in a specific temperature range. Therefore, the semiconductor integrated circuit device according to the first embodiment of the invention can deal with the variations in temperature dependence of the write current threshold between the memory cells.

In the semiconductor integrated circuit device such as an MRAM of the structure having memory cells MC that include magneto-resistance elements VR, when the write current is excessively large as illustrated in FIG. 2, the memory cell other than the write target memory cell may malfunction due to an influence of the magnetic field to be exerted on the write target memory cell. Therefore, the write current has an upper limit, and it is impossible to employ the manner of merely increasing the write current for dealing with the variations in write current threshold. Accordingly, the invention is significantly effective particularly on the MRAM and the like having the structure in which memory cell MC includes magneto-resistance element VR.

The semiconductor integrated circuit device according to the first embodiment of the invention has the structure in which digit line drive circuit 1 deals with the variations in threshold of write current IWDL flowing through digit line DL, but the invention is not restricted to this. The invention can be applied to various structures handling currents for data writing in the semiconductor integrated circuit devices. For example, the semiconductor integrated circuit device may have a constant current generating portion for write current IWBL, and bit line write current IWBL is supplied to bit line BL corresponding to the selected column based on the output current of the constant current generating portion. Further, the invention can be applied to a spin injection current, i.e., a write current in a spin injection magnetization inverting method in which a current is directly passed through the TMR element to invert directions of magnetic moments of upper and lower magnetic thin films by an action of spin (direction) of electrons.

In the semiconductor integrated circuit device according to the first embodiment of the invention, output current IWA of constant current generating circuit 21A has the negative temperature dependence, and output current IWB of constant current generating circuit 21B has the positive temperature dependence. However, this is not restrictive. Even when both currents IWA and IWB have the positive temperature dependences, or have the negative temperature dependences, the temperature dependence of write current IWDL can be arbitrarily set in the range between the gradients of currents IWA and IWB provided that currents IWA and IWB have different temperature dependences, respectively, and therefore the object of the invention can be achieved.

In the semiconductor integrated circuit device according to the first embodiment of the invention, constant current generating portion 51 has constant current generating circuits 21A and 21B. However, this structure is not restrictive. Such a structure may be employed that includes three or more constant current generating circuits providing currents of different temperature dependences, and can mix these output currents according to a set mixing rate.

Although the semiconductor integrated circuit device according to the first embodiment of the invention includes only one constant current generating portion 51, this structure is not restrictive. Memory cell array 50 may be divided into a plurality of blocks, and a plurality of constant current generating portions 51 may be arranged corresponding to the respective blocks. According to this structure, the mixing rate between currents IWA and IWB can be set for each block so that the set value achieving the correct writing of data into each memory cell MC can be obtained more reliably even when large variations are present between the memory cells included in memory cell array 50. Further, the time required for the tuning test of the write current can be reduced.

In the semiconductor integrated circuit device according to the first embodiment of the invention, memory cell MC has magneto-resistance element VR. However, this structure is not restrictive. The invention can be applied to a semiconductor integrated circuit device including memory cells not including the magneto-resistance element provided that the memory cell allows rewriting of stored data by passing the write current.

In the semiconductor integrated circuit device according to the first embodiment of the invention, memory cell MC is configured to store nonvolatilely the data. However, this is not restrictive. The invention can be applied to volatile memories such as a DRAM (Dynamic Random Access Memory) and an SRAM (Static Random Access Memory).

In the semiconductor integrated circuit device according to the first embodiment of the invention, the test device is configured to determine the current value of write current IWDL that allows correct writing of the data into memory cell MC, while changing the set value. However, this structure is not restrictive, and may be configured as follows. The test device first controls write and read circuits 52 and 53 to determine the current value of write current IWDL that allows correct writing of the data into memory cell MC at temperature T1, and then controls constant current generating circuits 21A and 21B to determine set values CODE_A and CODE_B corresponding to the determined current value. The test device also controls write and read circuits 52 and 53 to determine the current value of write current IWDL that allows correct writing of the data into memory cell MC at temperature T2, and then controls mixing circuit 22 to determine set value CODE_MIX corresponding to the determined current value.

In the semiconductor integrated circuit device according to the first embodiment of the invention, the test device is located outside semiconductor integrated circuit device 100. However, this structure is not restrictive. The semiconductor integrated circuit device may include the test device as a BIST (Built-In Self Test) circuit.

[Modification of Data Storage Circuit]

A modification of the data storage circuit in the semiconductor integrated circuit device according to the first embodiment of the invention will now be described with reference to the drawings.

Figure 15:
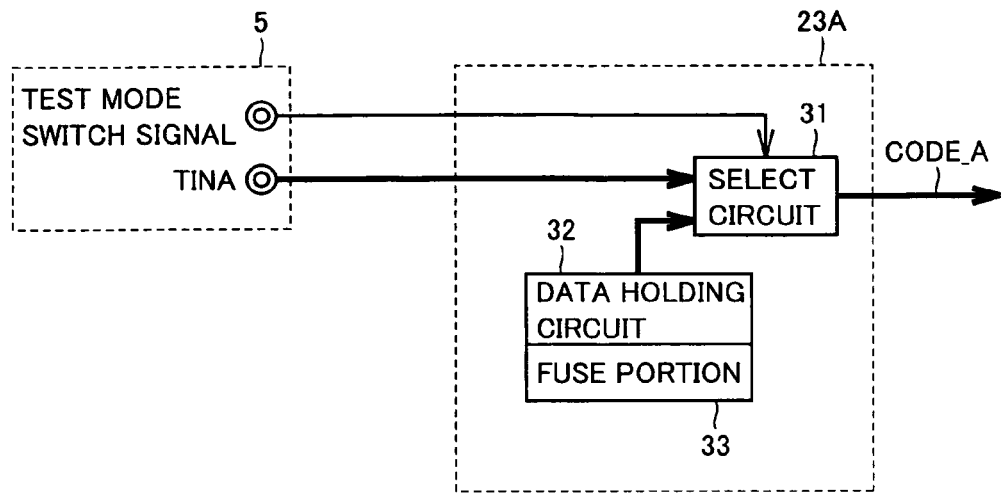
FIG. 15 is a function block diagram illustrating another example of the structure of the data storage circuit in the semiconductor integrated circuit device according to the first embodiment of the invention.

FIG. 15 is a function block diagram illustrating another example of the structure of the data storage circuit in the semiconductor integrated circuit device according to the first embodiment of the invention.

Referring to FIG. 15, data storage circuit 23A includes select circuit 31, data holding circuit 32 and a fuse portion 33.

Fuse portion 33 stores set value CODE_A. More specifically, fuse portion 33 includes fuses, e.g., of the number corresponding to the bit number of set value CODE_A. Each fuse can be blown by irradiation with laser beams, and an unblown and blown states correspond to "0" and "1" of data, respectively. Such a fuse may be employed that can be blown by flow of a large current. The fuse may be replaced with an element such as a ROM (Read Only Memory) that is electrically turned on by destroying an internal insulator.

Data holding circuit 32 holds the data corresponding to the blown/unblown state of each fuse included in fuse portion 33, and provides it to select circuit 31.

When the test mode switch signal received via interface circuit 5 indicates the tuning test operation, select circuit 31 provides test signal TINA received via interface circuit 5 to DA converter 24A as set value CODE_A.

When the test mode switch signal received from interface circuit 5 indicates the normal operation, select circuit 31 provides the data received from data holding circuit 32 to DA converter 24A as set value CODE_A.

In this case, set value CODE_A selected by the test device during the tuning test for write current IWDL illustrated in FIG. 12 is stored by irradiating one or more fuses in fuse portion 33 with the laser beams by an operator.

Owing to the provision of the fuses for nonvolatilely holding the set value as described above, the set value can be stably and reliably stored.

Other structures and operations are substantially the same as those of the data storage circuit shown in FIG. 7, and therefore description thereof is not repeated. Data storage circuits 23B and 23C have substantially the same structure as data storage circuit 23A, and operate substantially in the same manner except for that test signal TINA and set value CODE_A are replaced with test signal TINB or TINC and set value CODE_B or CODE_C, respectively. Therefore, description thereof is not repeated.

Another embodiment of the invention will now be described with reference to the drawings. In the figures, the same or corresponding portions bear the same reference numbers, and description thereof is not repeated.

Second Embodiment

A second embodiment relates to a semiconductor integrated circuit device prepared by adding a control circuit conducting a tuning test on the write current to the semiconductor integrated circuit device according to the first embodiment of the invention. Structures and operations thereof are substantially the same as those of the semiconductor integrated circuit device of the first embodiment except for the structures and operations described below.

Figure 16:
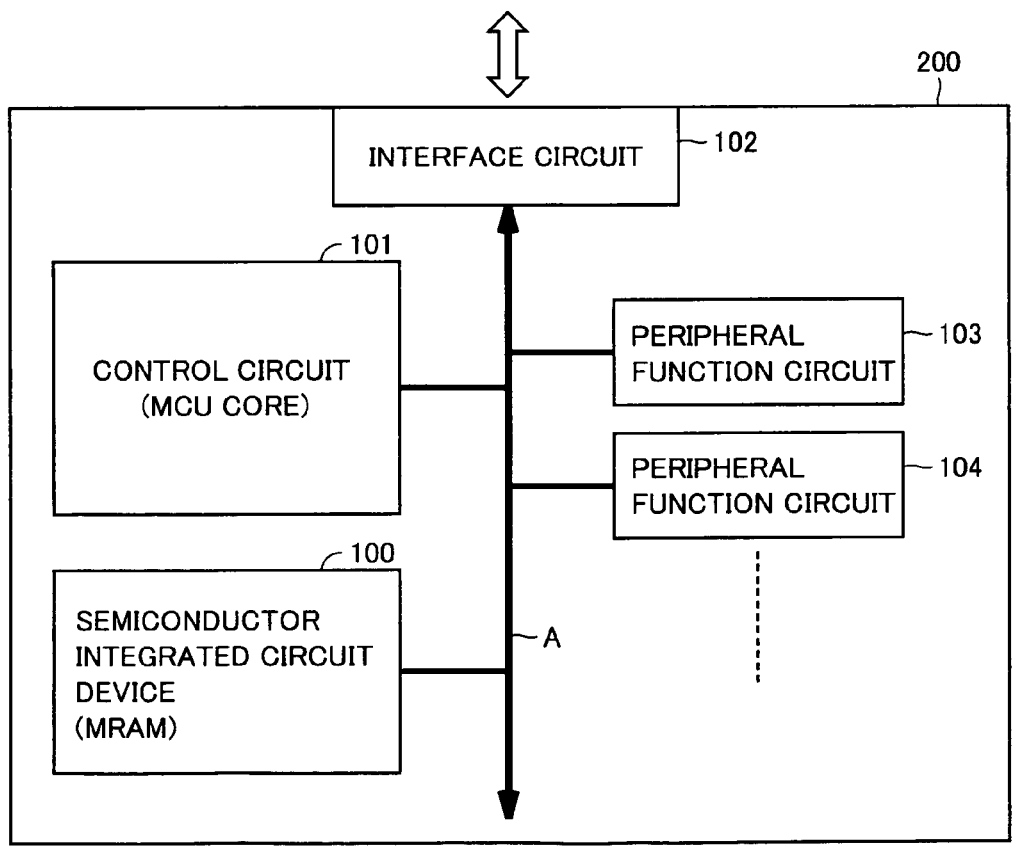
FIG. 16 is a function block diagram illustrating a structure of a semiconductor integrated circuit device according to a second embodiment of the invention.

FIG. 16 is a function block diagram illustrating the structure of the semiconductor integrated circuit device according to the second embodiment of the invention.

Referring to FIG. 16, a semiconductor integrated circuit device 200 is, e.g., an MCU (Micro-Controller Unit). Semiconductor integrated circuit device 200 includes semiconductor integrated circuit device 100 such as an MRAM, an MCU core (control circuit) 101, an interface circuit 102 and peripheral function circuits 103 and 104. Blocks are mutually connected by a bus A.

MCU core 101 controls each block in MCU 200. Addresses and data are externally transmitted via interface circuit 102 to and from MCU 200. Peripheral function circuits 103 and 104 achieve functions of memories such as an ROM and an RAM as well as a timer.

MCU core 101 controls MRAM 100 to perform the tuning test on write current IWDL of MRAM 100.

The operation of MCU core 101 in this tuning test is the same as that of the test device in the tuning test of write current IWDL illustrated in FIG. 12, and therefore description thereof is not repeated.

Figure 17:
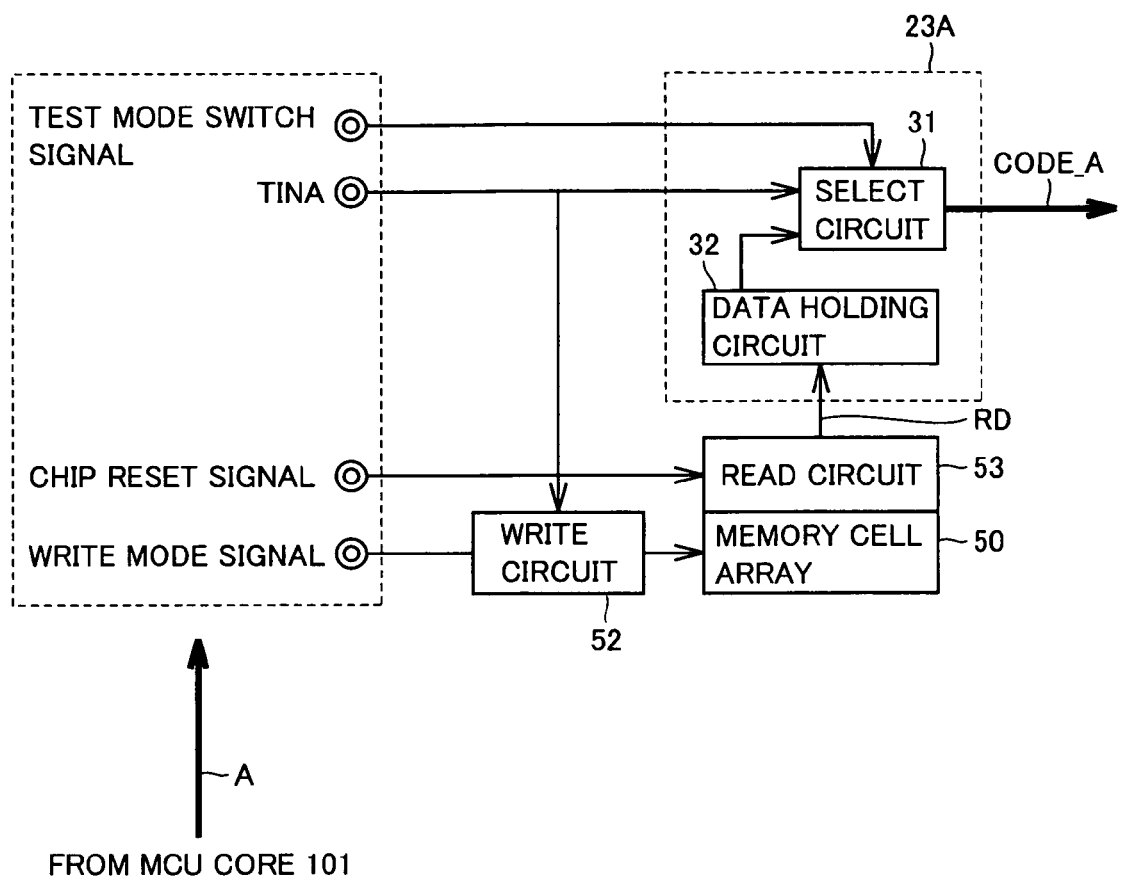
FIG. 17 is a function block diagram illustrating a structure of the data storage circuit and a structure storing set values in the data storage circuit in the semiconductor integrated circuit device according to a second embodiment of the invention.

FIG. 17 is a function block diagram illustrating a structure of a data storage circuit in the semiconductor integrated circuit device according to a second embodiment of the invention as well as a structure storing the set value in the data storage circuit.

In the tuning test of write current IWDL, MCU core 101 provides the test mode switch signal indicating the tuning test operation and test signal TINA to MRAM 100 via bus A.

When the tuning test ends, MCU core 101 changes the write mode signal from the disable logic to the enable logic, and provides it to write circuit 52 in MRAM 100 via bus A.

In the normal operation, MCU core 101 provides the test mode switch signal indicating the normal operation to MRAM 100 via bus A. When semiconductor integrated circuit device 100 is powered on, a chip reset signal is externally provided via a direct path or via MCU core 101.

Data storage circuits 23B and 23C have substantially the same structure as data storage circuit 23A except for that test signal TINA and set value CODE_A are replaced with test signal TINB or TINC and set value CODE_B or CODE_C, respectively, and therefore description thereof is not repeated.

The semiconductor integrated circuit device according to the second embodiment of the invention can automatically perform the tuning test on write current IWDL without using a special device in contrast to the semiconductor integrated circuit device according to the first embodiment, and therefore can achieve simplification of the equipment for the tuning test and reduction in test time, and thus can reduce the test cost.

In the semiconductor integrated circuit device according to the first embodiment, it is necessary to provide externally current IWA via the terminal of semiconductor integrated circuit device 100 from constant current generating circuit 21A for measuring currents IWA and IWB. However, in the semiconductor integrated circuit device according to the second embodiment of the invention, MCU core 101 can measure currents IWA and IWB within semiconductor integrated circuit device 200, and can simplify the equipment for the tuning test.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
  a plurality of memory cells storing data;
  a write current line arranged near said memory cells or electrically connected to said memory cells;
  a first constant current generating circuit providing an output current having a temperature dependence;
  a second constant current generating circuit providing an output current having a temperature dependence different from that of the output current of said first constant current generating circuit;
  a mixing circuit mixing the output currents of said first and second constant current generating circuits together to provide a composite current at a variable mixing rate;
  a write circuit electrically connected to said write current line, and writing data into said memory cell by passing a write current through said write current line based on the composite current provided by said mixing circuit; and
  a data storage circuit storing first to third set values, wherein
  said first constant current generating circuit further changes the value of the output current based on said first set value,
  said second constant current generating circuit further changes the value of the output current based on said second set value, and
  said mixing circuit changes said mixing rate based on said third set value.

2. The semiconductor integrated circuit device according to claim 1, wherein
  said data storage circuit is one or more memory cells among said plurality of memory cells.

3. The semiconductor integrated circuit device according to claim 2, further comprising:
  a read circuit reading said first to third set values from said one or more memory cells; and
  a data holding circuit holding said first to third set values read by said read circuit, wherein
  said first constant current generating circuit changes the output current value based on said first set value held by said data holding circuit,
  said second constant current generating circuit changes the output current value based on said second set value held by said data holding circuit, and
  said mixing circuit changes said mixing rate based on said third set value held by said data holding circuit.

4. The semiconductor integrated circuit device according to claim 3, wherein said semiconductor integrated circuit device is an MRAM.

5. The semiconductor integrated circuit device according to claim 1, wherein said data storage circuit nonvolatilely holds said first to third set values.

6. The semiconductor integrated circuit device according to claim 5, wherein
  said data storage circuit includes first to third fusible fuses corresponding to said first to third set values, respectively,
  said first constant current generating circuit changes the output current value based on a fused/unfused state of said first fuse,
  said second constant current generating circuit changes the output current value based on the fused/unfused state of said second fuse, and
  said mixing circuit changes said mixing rate based the fused/unfused state of said third fuse.

7. The semiconductor integrated circuit device according to claim 1, wherein
  at least one of said first and second constant current generating circuits includes:
  a transistor providing a current,
  a first resistance having a resistance value changing according to said first or second set value, and
  a second resistance having said temperature dependence; and
  the output current of said transistor changes according to the resistance values of said first and second resistances.

8. A semiconductor integrated circuit device comprising:
  a plurality of memory cells storing data;

a write current line arranged near said memory cells or electrically connected to said memory cells;

a first constant current generating circuit providing an output current having a temperature dependence;

a second constant current generating circuit providing an output current having a temperature dependence different from that of the output current of said first constant current generating circuit;

a mixing circuit mixing the output currents of said first and second constant current generating circuits together to provide a composite current at a variable mixing rate; and a write circuit electrically connected to said write current line, and writing data into said memory cell by passing a write current through said write current line based on the composite current provided by said mixing circuit, wherein said mixing circuit includes first transistors of n (n is a natural number larger than one) in number each providing a current corresponding to the output current of said first constant current generating circuit, second transistors of n in number each providing a current corresponding to the output current of said second constant current generating circuit, and a switch circuit selecting said first and second transistors of n in total number, and connecting outputs of said selected transistors in parallel together.

9. A semiconductor integrated circuit device comprising:

a plurality of memory cells storing data;

a write current line arranged near said memory cells or electrically connected to said memory cells;

a first constant current generating circuit providing an output current having a temperature dependence;

a second constant current generating circuit providing an output current having a temperature dependence different from that of the output current of said first constant current generating circuit;

a mixing circuit mixing the output currents of said first and second constant current generating circuits together to provide a composite current at a variable mixing rate;

a write circuit electrically connected to said write current line, and writing data into said memory cell by passing a write current through said write current line based on the composite current provided by said mixing circuit;

a read circuit performing data reading on said memory cell; and a control circuit controlling said write circuit and said read circuit to determine a value of a first write current to be passed through said write current line for correctly performing data writing on said memory cell at a first temperature, controlling said first constant current generating circuit such that the output current of said first constant current generating circuit takes substantially the same current value as said determined first write current value, controlling said second constant current generating circuit such that the output current of said second constant current generating circuit takes substantially the same current value as said determined first write current value, controlling said write circuit and said read circuit to determine a value of a second write current to be passed through said write current line for correctly performing data writing on said memory cell at a second temperature, and deciding a mixing rate of said mixing circuit such that the output circuit of said mixing circuit takes substantially the same current value as said measured second write current value.

* * * * *